United States Patent [19]

Amano

[11] Patent Number: 5,005,071
[45] Date of Patent: Apr. 2, 1991

[54] SEMICONDUCTOR DEVICE
[75] Inventor: Haruo Amano, Tokyo, Japan
[73] Assignee: NEC Corporation, Tokyo, Japan
[21] Appl. No.: 942,184
[22] Filed: Dec. 16, 1986

Related U.S. Application Data

[62] Division of Ser. No. 755,897, Jul. 17, 1985, Pat. No. 4,650,744.

[30] Foreign Application Priority Data

Jul. 17, 1984 [JP] Japan .................................. 59-148112

[51] Int. Cl.$^5$ .......................................... H01L 23/544
[52] U.S. Cl. ........................................ 357/85; 356/372; 357/68
[58] Field of Search ...................... 357/85, 68; 356/372, 356/384

[56] References Cited

U.S. PATENT DOCUMENTS

| 3,987,418 | 10/1976 | Buchanan | 357/41 |
| 4,639,142 | 1/1987 | Chew et al. | 356/372 |

FOREIGN PATENT DOCUMENTS

| 53-75768 | 7/1978 | Japan | 357/85 |
| 57-7933 | 1/1982 | Japan | 357/85 |

Primary Examiner—William D. Larkins
Attorney, Agent, or Firm—Burns, Doane, Swecker & Mathis

[57] ABSTRACT

On a film to be etched by the isotropic etching method to form electrodes, wiring layers or the like, a first mask and a second mask are provided. The first mask is used for forming the electrodes, wiring layers or the like. The second mask is used for forming a checking pattern from the film to determine the progress of etching. The second mask comprises a plurality of straight lines of different widths and at least one mark pattern indicating one of the straight lines. Upon progress of the isotropic etching, parts of the film under the narrowest and narrower straight lines of the second mask are completely etched by side etching phenomenon which proceeds under the mask with parts of the film under wider straight lines being survived. The mark of the film transferred from the mark pattern of the second mask indicates the position under a predetrmined one of the straight lines of the second mask. A worker can easily recognize whether or not the film exists at that position and determine the progress of etching.

3 Claims, 3 Drawing Sheets

SEMICONDUCTOR DEVICE

This application is a division, of application Ser. No. 755,897, filed July 17, 1985, now U.S. Pat. No. 4,650,744.

BACKGROUND OF THE INVENTION

The present invention relates to a method of manufacturing a semiconductor device, and more particularly to an effective etching process by using a check pattern provided on a semiconductor substrate.

A plurality of semiconductor elements are manufactured in a semiconductor wafer through various process steps including etching processes. Generally, the etching processes are conducted by using photo-resist of different patterns as masks to form openings in an insulating layer formed on a major surface of a semiconductor substrate, that is, the semiconductor wafer, electrodes, and wiring layers on the insulating layer. The etching processes are classified into isotropic etching and anisotropic etching. A wet etching employing etching liquid is the isotropic etching, and a dry etching in which etching liquid is not used but etching gasses in a chamber is used includes both of the isotropic etching and the anisotropic etching according to the kinds of gasses used and the manner of applying electric field in the chamber. The anisotropic etching can shape a fine pattern of a film precisely because a side etching phenomenon (etching proceeds horizontally under a mask member) does not occur. However, when the anisotropic etching is conducted, a material under the film to be etched must be strictly selected so that the material is not etched during the etching process. Namely, in the anisotropic etching, differences in etching speeds of various materials are sometimes small and therefore, there are many restrictions in etching conditions and in selection of materials of the film to be etched and a substrate or a layer under the film to be etched. On the other hand, in the isotropic etching, differences in etching speeds of various materials are large in many cases. Therefore, the isotropic etching can be easily used in manufacturing the semiconductor device. However, the side etching phenomenon under the mask member is inevitable in the isotropic etching. Therefore, when a fine pattern is to be formed on the film by the isotropic etching, a precise control of the etching and a reliable checking of the etching are necessary.

SUMMARY OF THE INVENTION

Accordingly, an object of the present invention is to provide an effective method of manufacturing a semiconductor device in which a fine film pattern can be precisely formed by the isotropic etching with a high reliability.

Another object of the present invention is to provide a reliable semiconductor device which can be provided with precise electrodes and wiring layers.

According to one feature of the present invention, there is provided a method of manufacturing a semiconductor device comprising steps of forming a film on an element forming area of a semiconductor substrate via a first insulating layer such as a silicon dioxide layer and on an area of the semiconductor substrate outside the element forming area via a second insulating layer such as a silicon dioxide layer, forming a first mask pattern on a first portion of the film positioned on the element forming area of the semiconductor substrate and a second mask pattern on a second portion of the film positioned on the area of the semiconductor substrate outside the element forming area, the second mask pattern including a plurality of straight lines arranged in parallel with predetermined intervals and at least one mark pattern such as notch indicating one of the straight lines, the straight lines having different widths and being arrayed in the order from one with a wider width to one with a narrower width, and conducting isotropic etching to the first portion of the film by using the first mask pattern as a mask and to the second portion of the film by using the second mask pattern as a mask. Favorably, a difference between the width of a first straight line and the width of a second straight line adjacent to the first straight line ranges from 0.3 $\mu$m to 0.7 $\mu$m. The isotropic etching may be wet etching or dry etching. Generally, the mask may be made of photo-resist, and the film to be etched may be formed by polycrystalline silicon or metallic material such as aluminum or aluminum alloy.

According to the present invention, when the first portion of the film is patterned by the isotropic etching to form electrodes such as gate electrodes and/or wiring layers, the second portion of the film is also patterned to form a checking pattern to estimate the etching conditions. Upon progress of etching, a part of the second portion under the narrowest straight line of the second mask is etched away to vanish by the side etching phenomenon, and then a part under the second narrowest line. Therefore, one can recognize the amount of etching by inspecting what parts of the second portion under the straight lines disappear. Further, according to the present invention, the second mask is provided with a mark pattern such as a notch, and therefore, the second portion of the film being etched has the mark as an indicium by which a worker can easily determine the progress of etching without counting the vanished parts. Thus, the mark may be used to indicate such a part that defines a lower limit or a higher limit of the progress of etching, or to indicate that the etching is to be stopped. Namely, the mark may be used in such a manner that if the part indicated by the mark is retained, the etching is determined to be unsufficient, or else, if the part indicated by the mark disappears, the etching is determined to be excessive.

The checking pattern of etching (the second portion) according to the invention may be provided in all the semiconductor devices (pellets or chips) on a semiconductor wafer, so that the etching condition can be inspected in every locations, central and peripheral, of the semiconductor wafer.

According to another aspect of the present invention, there is provided a semiconductor device comprising a semiconductor substrate having an element forming area and a checking area, a field insulating film formed on the checking area of the semiconductor substrate, and a checking pattern for inspecting an etching condition formed on the field insulating film, the checking pattern including at least one frame portion extending in one direction a plurality of straight lines extending in a direction normal to the frame portion, connected to the frame portion and arranged in parallel with each other with predetermined intervals, the straight lines having different widths and an indicium formed in the frame portion. The checking pattern may be made of polycrystalline silicon or metallic material such as aluminum, aluminum alloy, etc. The indicium indicates one of the straight lines.

DESCRIPTION OF THE EMBODIMENT

Figure 1:
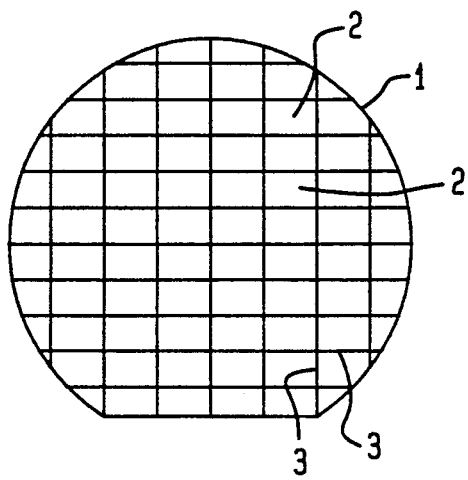
FIG. 1 is a plan view showing a semiconductor wafer.
Figure 2:
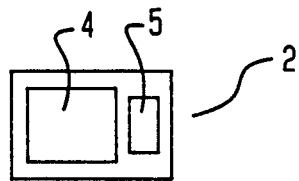
FIG. 2 is a plan view showing one of semiconductor devices provided in the semiconductor wafer.

Referring to FIGS. 1 and 2, a semiconductor wafer of silicon comprises a plurality of semiconductor devices 2 in a matrix shape formed by row and column scribe lines 3. Each semiconductor device 2 includes an element forming area 4 and a checking area 5 on which a checking pattern of the present invention is formed. After the wafer is subjected to necessary processes including etching process, it is divided into semiconductor devices along the scribe lines through the dicing process, which are then each subjected to bonding and packaging processes.

Figure 3A:
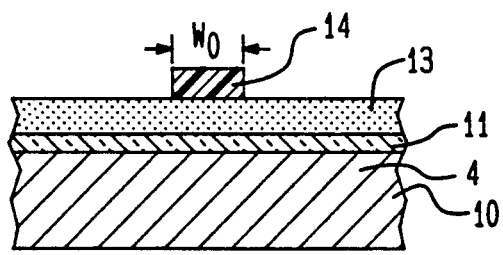
FIGS. 3A and 3B are cross-sectional views of an electrode or a wiring layer on an element forming area of a semiconductor substrate before and after etching, respectively.
Figure 3B:
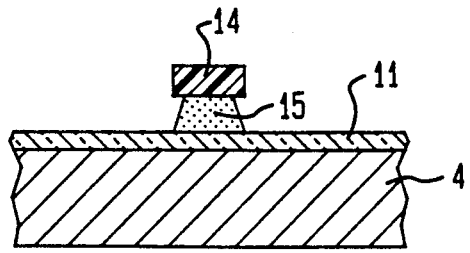
Figure 4A:
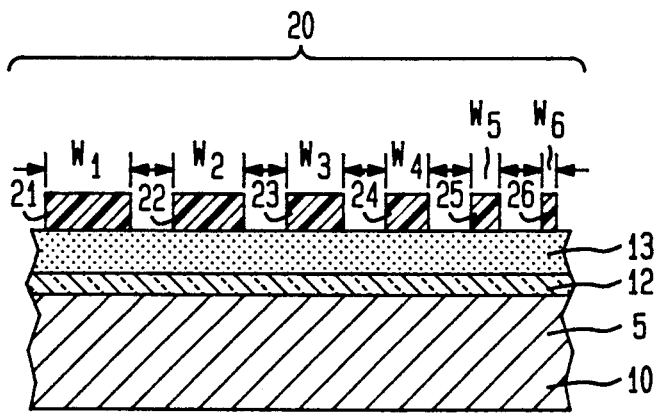
FIGS. 4A to 4C are cross-sectional views of a checking portion at the different stages of etching according to one embodiment of the present invention.
Figure 4B:
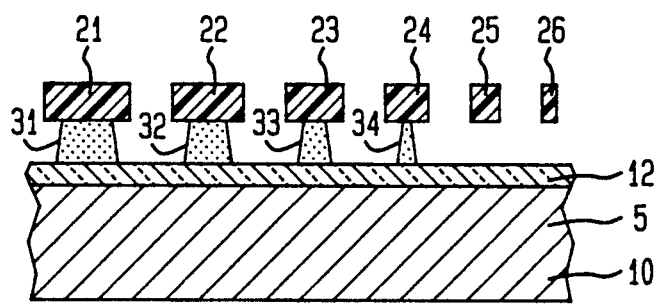
Figure 4C:
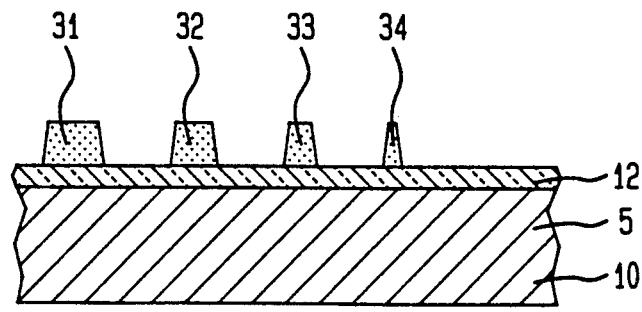
Figure 5A:
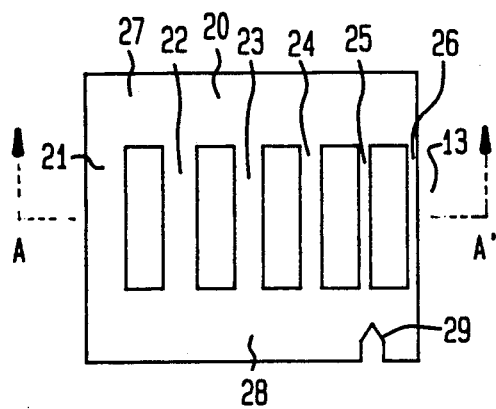
FIGS. 5A and 5B are plan views of the checking portion at the different stages of etching in the embodiment of the present invention, the FIGS. 4A and 4C being cross-sectional views taken along lines A—A' and C—C' of the FIGS. 5A and 5B, respectively, as viewed in the direction of the arrows.

Referring to FIGS. 3 to 5, one embodiment of the present invention for forming a silicon gate structure will be explained. A gate insulating layer 11 of silicon dioxide is provided on the element forming area 4 of a silicon substrate 10 in which various elements (not shown) are to be formed (FIG. 3A), and a field oxide layer 12 is provided on the checking area 5 of the silicon substrate 10 outside the element forming area (FIG. 4A). A polycrystalline silicon film 13 of 0.5 μm thickness is formed on the gate insulating layer 11 (FIG. 3A) and on the field oxide layer 12 (FIG. 4A). Next, a photo-resist mask pattern 14 having the width $W_0$ of 2.5 μm is formed on the silicon film above the element forming area 4 as shown in FIG. 3A. Also, as shown in FIGS. 4A and 5A, a photo-resist mask pattern 20 for checking according to the present invention is formed on the silicon film 13 above the checking area 5 of the silicon substrate 10. The photo-resist mask pattern 20 has first and second frame portions 27, 28, a first straight line 21 having a largest width $W_1$ 3.0 μm, a second straight line 22 having a second largest width $W_2$ of 2.5 μm, a third straight line 23 having a width $W_3$ of 2.0 μm, a fourth straight line 24 having a width $W_4$ of 1.5 μm, a fifth straight line 25 having a width $W_5$ of 1.0 μm, and a narrowest sixth straight line 26 having a width $W_6$ of 0.5 μm. The straight lines 21 to 26 are positioned between and connected to the frame portions 27, 28. Further, the photo-resist mask pattern 20 has a notch 29 as an indicium in the frame portion 28 indicating the fifth straight line 25 at its arrow like tip (see FIG. 5A). Then, an isotropic dry etching or an isotropic wet etching is conducted over the semiconductor wafer. For example, for the dry etching, mixture gasses of carbon floride ($CF_4$) and oxygen ($O_2$) are used in a chamber and RF power of 200 W is applied for about 2 minutes. If the polycrystalline silicon film is replaced by an aluminum film, only a wet etching is conducted as to isotropic etching by using etching liquid composed of, for example, phosphoric acid ($H_3PO_4$), nitric acid ($HNO_3$) and acetic acid ($CH_3COOH$).

Figure 5B:
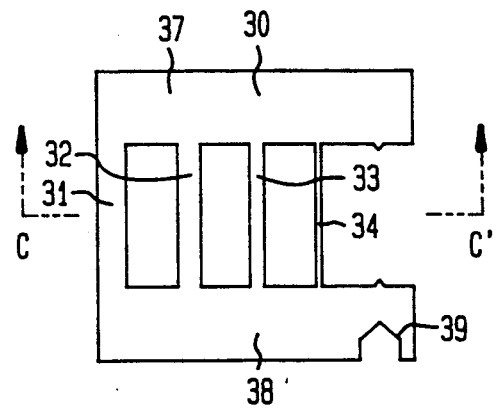

After the isotropic etching process has been completed, a silicon gate electrode 15 (see FIG. 3B) is shaped under the photo-resist mask pattern 14. The width of the electrode 15 is less than that of the photo-resist mask pattern, particularly at its upper surface, by the side etching phenomenon. It is to be noted that the isotropic etching also progresses at a portion of the polycrystalline silicon film above the checking area 5 through the photo-resist mask pattern 20. As shown in FIG. 4B, parts of the silicon film 13 under the fifth and sixth straight lines 25, 26 of the photo-resist mask pattern 20 are completely etched away, and parts 31 to 34 of the silicon film 13 under the first to fourth straight lines 21 to 24 are survived. This means that the amount of the side etching from one side during the isotropic etching is more than 0.5 μm ($\frac{1}{2} \cdot W_5$) and less than 0.75 μm ($\frac{1}{2} \cdot W_4$). Namely, a worker can recognize that the silicon gate 15 shaped by the isotropic etching process has the width of about 1.0 μm and below 1.5 μm. The photo-resist mask pattern is removed, and the polycrystalline pattern, that is, a checking pattern is exposed as shown in FIGS. 4C and 5B. When the width of the gate electrode 15 at both of its upper and bottom surfaces is to be less than 1.5 μm and more than 1.0 μm, it is easily determined by inspecting the checking pattern shown in FIGS. 4C and 5B whether or not the width is within the allowable range. More particularly, the checking pattern of the silicon film is provided with the indicating notch 39 at the frame portion 38 which is formed by the notch 29 of the photo-resist mask pattern 20. In this case, the notch 39 indicates the widest part (below 25) between frame potions 37, 38 to be completely removed. Therefore, the worker can easily determine the lower limit of the side etching, that is, the lower limit of the amount of the isotropic etching.

Figure 6A:
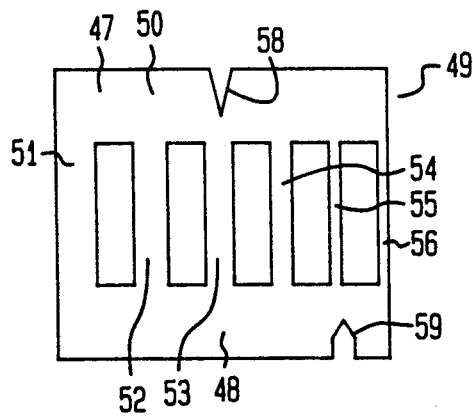
FIGS. 6A and 6B are plan views of the checking portion in another embodiment of the present invention.
Figure 6B:
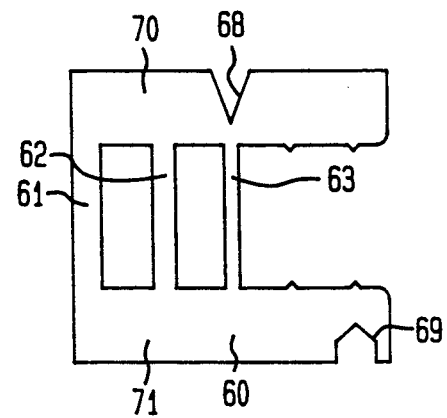

Referring to FIGS. 6A and 6B showing another embodiment, a photo-resist pattern 50 corresponding to the pattern 20 in FIG. 5A is formed on a film 49 of polycrystalline silicon, aluminum, etc., and it comprises frame portions 47, 48 and first to sixth straight lines 51 to 56. The widths of the lines 51 to 56 are gradually decreased with a constant difference, like the straight lines 21 to 26 in the former embodiment. The photo-resist mask pattern 50 further comprises a first notch 59 in one of the frame portion 48 indicating the fifth straight line 55 and a second notch 58 in the other frame portion 47 indicating the third straight line 53. After the isotropic etching is conducted to the film 49, the photo-resist mask pattern 50 is removed and the film pattern 60 is exposed as shown in FIG. 6B. Parts 61, 62, 63 of the film positioned under the first, second and third straight lines 51, 52, 53 of the photo-resist mask pattern are survived between the frame portions 70, 71 of the film. However, parts of the film under the fourth, fifth and sixth straight lines 54, 55, 56 of the photo-resist mask pattern vanish by being completely etched by the side etching phenomenon. The film pattern 60 further comprises a first indicating notching 69 in the frame portion 71 of the film by the notch pattern 59 of the photo-resist mask pattern and a second indicating notching 68 in the other frame portion 70 of the film by the notch pattern 58 of the photo-resist mask pattern. The first indicating notch 69 can estimate a lower limit of the amount of isotropic etching and the second indicating notch 68 can estimate a higher limit of the amount of isotropic etching. Assuming that it is preliminarily determined that any film does not exist in portion indicated by the first indicating notch 69 and the film 63 exists in the portion indicated by the second indicating notch 68 as shown in FIG. 6B, then the amount of side etching is allowable, the worker can easily recognize whether or not the etching process is good by observing the notches 68 and 69. By using the indicating notches 39 (in FIG. 5B), 68, 69 (in FIG. 6B), the etching conditions can be evaluated at a glance, and therefore, an efficient and reliable checking of isotropic etching can be expected.

What is claimed is:

1. A semiconductor device comprising a semiconductor substrate having an element forming area and a checking area, a field insulating film formed on said checking area of said semiconductor substrate, and a checking pattern for inspecting an etching condition formed on said field insulating film, said checking pattern including first and second stripe-like frame portions extending in a first direction in parallel with each other, each of said first and second stripe-like frame portions having an inner side line and an outer side line with a constant width between said inner and outer side lines, and a plurality of straight lines bridging respective parts of said inner side lines of said first and second stripe-like frame portions, said straight lines having different widths and extending in parallel with each other in a second direction perpendicular to said first direction with predetermined intervals, a first indicium formed in said first stripe-like frame portion from a part of said outer side line thereof inwardly, said first indicium indicating a pair of parts of respective said inner side lines of said first and second stripe-like frame portions being free from any straight line bridging said pair of parts, and a second indicium being formed in said second stripe-like frame portion from a part of said outer side line thereof inwardly, said second indicium indicating one of said straight lines.

2. A semiconductor device as claimed in claim 1, in which said checking pattern is made of polycrystalline silicon.

3. A semiconductor device as claimed in claim 1, in which said checking pattern is made of metallic material.

* * * * *